United States Patent
Urry et al.

(10) Patent No.: US 6,556,685 B1
(45) Date of Patent: Apr. 29, 2003

(54) COMPANDING NOISE REDUCTION SYSTEM WITH SIMULTANEOUS ENCODE AND DECODE

(75) Inventors: Robin M. Urry, Draper, UT (US); Roger T. Johnsen, Salt Lake City, UT (US)

(73) Assignee: Harman Music Group, Sandy, UT (US)

( * ) Notice: Subject to any disclaimer, the term of this patent is extended or adjusted under 35 U.S.C. 154(b) by 0 days.

(21) Appl. No.: 09/188,003

(22) Filed: Nov. 6, 1998

(51) Int. Cl.[7] .............................................. H04B 15/00
(52) U.S. Cl. ..................... 381/94.1; 381/94.5; 381/94.8
(58) Field of Search ........................ 381/57, 94.1, 106, 381/102, 104, 107, 108, 109, 22–23, 94.5, 94.6, 94.8; 333/14; 455/72

(56) References Cited

U.S. PATENT DOCUMENTS

| | | | | |
|---|---|---|---|---|
| 3,789,143 A | | 1/1974 | Blackmer | |
| 3,795,876 A | * | 3/1974 | Takahashi | 333/14 |
| 3,903,485 A | * | 9/1975 | Dolby | 323/81 |
| 4,101,849 A | * | 7/1978 | Blackmer et al. | |
| 4,103,239 A | * | 7/1978 | Meewezen | 325/144 |
| 4,169,219 A | * | 9/1979 | Beard | 360/27 |
| 4,224,581 A | * | 9/1980 | Watanabe et al. | 307/264 |
| 4,250,470 A | * | 2/1981 | Szarvas | |
| 4,490,691 A | * | 12/1984 | Dolby | |

* cited by examiner

Primary Examiner—Duc Nguyen
(74) Attorney, Agent, or Firm—Thorpe North & Western, LLP (57) ABSTRACT

A system and method for reducing noise in an audio signal. The system includes an encoder, a decoder and a single feedforward sidechain for generating a control signal that is used as input to a variable gain element in the encoder and in the decoder. The system is substantially audibly transparent, minimizes audible noise modulation, minimizes dynamic distortion of low frequency signals due to a level detector tracking these waveforms, minimizes distortion of signals due to phase shift in a transmission channel, minimizes distortion of fast, high-level transients due to the attack time of the level detector, and has virtually no effect on the audio signal if the level of the signal stays within a reasonable range around the nominal signal level.

31 Claims, 4 Drawing Sheets

COMPANDING NOISE REDUCTION SYSTEM WITH SIMULTANEOUS ENCODE AND DECODE

BACKGROUND

1. Field of the Invention

The present invention is in the field of audio signal processing, more specifically in the field of audio dynamics processing utilizing variable gain elements to compress and expand audio frequency signals for noise reduction purposes.

2. State of the Art

In the 1970's, companding noise reduction systems—that is, audio systems employing complementary compression and expansion processes—became popular as a means to reduce the noise floor and increase the headroom of the analog magnetic tape recording process for higher fidelity, wider dynamic range recordings. By compressing (encoding) an input signal exhibiting a dynamic is range of 120 dB, for example, by a 2:1 ratio, the signal could then be passed through a transmission path, medium or "noisy channel" having a limited dynamic range of 60 dB. Then, by complementarily expanding (decoding) the signal at the output of the transmission path or medium by a 1:2 ratio, the 120 dB dynamic range of the original signal would theoretically be preserved. This type of process was successfully applied to other "noisy channel" transmission systems exhibiting limited dynamic range such as FM broadcasts and telecommunications. It should be understood that a transmission path, medium or channel is being used to refer to any type of audio processing system having a limited dynamic range.

In the last twenty years, the two most popular trade names associated with companding noise reduction systems have been dbx® and Dolby®. A particularly important patent in this field by David E. Blackmer, U.S. Pat. No. 3,789,143, granted Jan. 29, 1974, describes a method of dbx-type noise reduction wherein compression and expansion are complementary in time response. Principles in this patent form the basis of complementary noise reduction systems used by dbx®, Dolby®, and others. The typical design of these systems, as illustrated in the aforementioned Blackmer patent, consists of two separate circuits-an encoder circuit and a decoder circuit. Each of these circuits, in their most simple form, includes a main audio path consisting of a variable gain element having an audio input port and an audio output port, and a detector path or "sidechain" having a circuit that detects the audio signal level and creates a control signal. Typically, there are other circuits in the sidechain which are "downstream" from the detector, whose function is to shape or process the control signal—this processed control signal being used to control the gain of the variable gain element. More complex noise reduction schemes may include additional circuits in the sidechain that pre-process the audio "upstream" from the level detector.

In each of these well-known systems, there exists two sidechains-one for the encoder and one for the decoder. Typically, the encoder uses a feedback circuit topology wherein the input signal to the encoder sidechain is the audio output signal of the encoder. Conversely, the typical circuit topology of the decoder is feedforward wherein the input signal to the decoder sidechain is the audio input signal of the decoder. These sidechains are substantially identical other than the fact that they create control voltages which cause opposite reactions in their respective variable gain elements. That is, when one variable gain element is adding gain to the audio signal passing through it, the other is complementarily attenuating the audio signal by the same amount.

The main advantage of this feedback encoder and feedforward decoder arrangement is its complementary nature because the input signal that the decoder sidechain "sees" is substantially the same input signal that the encoder sidechain sees having only the noisy channel between the inputs of the two sidechains. Of course, the noisy channel will add some noise and distortion and may exhibit frequency response anomalies which would alter the "clean" signal that the encoder is acting upon, thus presenting an altered signal to the decoder, but with properly designed sidechain circuitry, the sidechain detectors react appropriately to the signal. Thus, with substantially identical encoder and decoder sidechains acting upon substantially the same signal, the decoder operates in a substantially complementary manner to the encoder.

A person unfamiliar with noise reduction systems might naturally question the need for having two separate sidechains in the system, especially when the circuitry is substantially identical in each, and each detector is intended to react to substantially the same signal. The answer is, that for traditional uses of noise reduction it is not possible to share sidechain circuitry without adding unnecessary complexity to the system. For example, in analog tape recording, encoding occurs during the recording process making use of the encoder sidechain. Because playback can occur in a different location than where the recording took place, the decoder must have its own sidechain electronics in the playback system. A similar need for the separate decoder sidechain is obviously needed for noise reduction on radio broadcasts as well. One way around this is to record the decode signal onto tape in parallel with the audio signal or, for broadcasts, to transmit the decode signal along with the audio. Both methods would add unnecessary complexity to the encoder as well as require additional bandwidth or an extra channel in the transmission path, neither of which are desirable nor required to obtain reasonable performance.

However, as is well known to those skilled in the art, one of the biggest problems with these types of noise reduction systems is that they require components of the decoder sidechain to be closely matched with corresponding components of the encoder sidechain to avoid frequency and gain errors. Also, the operating levels of the system comprising the "noisy channel" must be calibrated to the same operating levels to which the compander is calibrated to avoid mistracking and gain errors. If close matching is not maintained, this "semi-complementary" processing may produce very audible and unpleasant artifacts. This is not easy to do in manufacturing and components may drift over time and through aging and temperature cycling. Other mistracking errors occur when the noisy channel does not behave in a predictable manner. For instance, analog tape may have "dropouts" in level and various brands and types of tape, or even various levels of quality within one type of tape, will cause errors and mistracking due to inconsistent frequency response and other non-linearities.

Another problem associated with noise reduction systems, due to the minimum compression and expansion ratios-typically 2:1 or greater-required to achieve satisfactory levels of noise reduction and increased headroom through the limited dynamic range channel, is that the noise level is audibly modulated by the level of the audio signal, a phenomenon known as "breathing." Other problems include dynamic distortion of low frequency waveforms if the level detectors are too fast and thus track these waveforms, and distortion of fast, high-level transients if the level detectors are not fast enough to react to the audio. Lastly, the sheer number of components in good noise reduction systems makes them costly to implement on a per-channel basis.

Turning the focus to the present invention, the inventors considered the problem of how to achieve a wider dynamic range from a system that many audio professionals never really considered to be the "weak link" in the audio chain. For years, in most systems, either analog tape or the broadcast channel was the limiting factor in overall system dynamic range even when employing a noise reduction system such as dbx®. The electronic noise from solid state devices such as equalizers was a minor factor and was often completely ignored. But as digital recording brought increased dynamic range to the audio signal chain, people began paying more attention to the electronic noise contributed by other equipment and began looking more closely at the equipment's printed specifications. In the specific case of an audio equalizer, it is not difficult for a manufacturer of graphic equalizers to design an equalizer with dynamic range specifications exceeding 106 dB, where the noise floor is 90 dB below the nominal signal level and the clip point is 16 dB above the nominal signal level. This is more than 10 dB greater dynamic range than typical 16-bit digital performance.

This 106 dB dynamic range specification for a graphic equalizer would lead the inexperienced, as well as many veteran audio professionals, to believe that their equalizer exhibits more-than-adequate noise performance for digital recording. But the truly experienced professional knows that when the audio signal is equalized, this is done at the expense of increased noise levels, not simply due to boosting the noise "upstream" from the equalizer, but also due to self-noise generated within the equalizer itself which is most apparent in critical recording or when equalizing a live concert system where the noise floor is boosted to concert levels. The experienced professional knows, as well as the designer of the equalizer, that this specification is measured with all frequency gain controls set in the 0 dB or "flat" position which is only a partially useful specification because it does not represent the real noise performance of the equalizer in actual use. The designer of the equalizer (hopefully) knows that the 90 dB signal-to-noise ratio specification is destroyed as soon as any frequency band is boosted. Likewise, this self-generated equalizer noise is increased when any frequency band is cut-a fact of which many users of equalizers employing active circuitry are not aware. The 90 dB signal-to-noise ratio can easily be degraded to only 60 to 70 dB with radical equalization or degraded to 75 to 85 dB with only moderate equalization.

Self-generated equalizer noise is due to the electronic noise of the active filter or filters in the signal path of the particular frequency band or bands which are adjusted away from the 0 dB position. Also, any noise magnetically or capacitively coupled into the equalizer filter circuits will become apparent as frequency bands are adjusted away from 0 dB. As is well known by designers of equalizers, when a particular frequency band is in the flat position, the audio signal and noise generated by or coupled into that respective active filter circuit is nulled out by either the filter summing circuits or by shorting the filter output to ground, thus eliminating its noise contribution to the overall noise floor. For obvious reasons, manufacturers are hesitant to publish the whole truth of what happens to the noise floor with any amount of equalization. Also, to be fair, it would be difficult for the audio industry to standardize on a specification for measurement of noise that could be applied equitably to all equalizers given the variety of designs with their optimum and worst case settings varying from one design to another.

The result of using an equalizer in a real world situation is that it often becomes the weak link in the system when considering noise performance. So, although many audio professionals have not really considered this, an equalizer is just another example of a limited dynamic range system. With modern audio systems, higher fidelity performance is required from each component in the audio chain. By fitting an equalizer with a properly designed companding noise reduction system, a substantial improvement in the noise performance of the equalizer can be realized.

Thus, it would be an improvement over the state of the art to improve the performance of applicable weak links in the audio chain using a novel noise reduction topology and sidechain circuit for a class of limited dynamic range systems. Although existing noise reduction systems could be used to partially accomplish this basic purpose, they fail to solve the real problem. Specifically, an improved noise reduction system should be designed for limited dynamic range systems, such as graphic or parametric equalizers, which exhibit minimal or no time delay through the transmission channel. The improved system should work best when there is no delay, but should also be designed to handle minimal delays such as phase shifts through filter circuits while maintaining audible integrity.

It would be a further improvement to make the system adaptable to systems with longer than minimal delays, a digital delay for example, by delaying the decode signal by the same delay inherent in the transmission channel.

OBJECTS AND SUMMARY OF THE INVENTION

It is an object of the present invention to design a novel noise reduction system that does not exhibit the aforementioned problems of previous systems for use with limited dynamic range systems exhibiting minimal or no delay.

Specifically, a principal objective of the present invention is to provide a noise reduction system that is substantially audibly transparent for use in modern audio systems which exhibit wider dynamic range than, say, analog tape, thus requiring better sonic characteristics than existing noise reduction systems. Thus, to meet this objective, the present invention needs to minimize audible noise modulation or "breathing"; to minimize dynamic distortion of low frequency signals due to the level detector tracking these waveforms; to minimize distortion of signals due to phase shift in the transmission channel; to minimize distortion of fast, high-level transients due to the attack time of the level detector; and to have virtually no effect on the audio signal if the level of the signal stays within a reasonable range around the nominal signal level.

Another objective of the present invention is to design a noise reduction system that avoids the inherent problems of component matching between the encoder and the decoder due to component tolerances, component aging and temperature drifts.

Another objective of the present invention is to make the noise reduction circuit free of level matching adjustments over the life of the product, where settings of noise reduction parameters determined by electrical component choices would yield substantially repeatable results in manufacturing and stable functionality in field use.

Another objective of the present invention is to eliminate, where possible, any errors due to non-linearities associated with the noisy channel itself which would result in the decoder not functioning in an adequately complementary manner to the encoder.

A final objective of the present invention is to design a noise reduction circuit that is relatively inexpensive so that it can be included in the circuitry of any system which could benefit from the use of this noise reduction without incurring excessive added cost that would unduly burden the retail price of the system.

One of the novel features of the invention which makes accomplishing these objectives possible is a unique noise reduction circuit topology wherein the encoder and decoder share the same feedforward sidechain, thus generating a single control voltage derived from the characteristics of only one signal for simultaneously controlling their respective variable gain elements. This one signal is the audio input signal to the encoder making the sidechain, by definition, a feedforward type. This topology, as opposed to the aforementioned methods utilizing two sidechains whose level detectors do not react to precisely the same signal, means that it is possible to meet the objective of avoiding the errors associated with component aging, drifting, and matching between the encoder and decoder by default as their sidechains are one and the same.

It is also possible to meet the objective of avoiding the need to match any levels between the encoder and the decoder sidechains because there is only one sidechain. Also, because this sidechain "looks at" only one audio signal to derive its variable gain element control voltage, it is possible to at least partially meet the objective that any errors due to non-linearities associated with the noisy channel itself are eliminated, because the decoder does not react to the altered audio signal that has passed through the noisy channel.

The presently preferred embodiment of the invention is substantially audibly transparent, thereby minimizing audible noise modulation, dynamic distortion of low frequency signals, distortion of signals due to phase shift in the transmission channel, and distortion of fast, and high-level transients. These objections are accomplished while there is virtually no effect at nominal signal levels as a result of the benefits gained by the feedforward circuit topology, by use of the preferred RMS method of level detection, by the design of the novel timing circuit, and by wise choice of noise reduction parameters, namely low and high threshold points. The design of the novel timing circuit also further satisfies the objective of minimizing errors due to non-linearities associated with the noisy channel itself which would result in the decoder not functioning in an adequately complementary manner to the encoder.

By employing a feedforward sidechain circuit topology, the distortion of low frequency signals is minimized by decreasing audio gain modulation due to the ripple on the control voltage controlling the variable gain element. A feedforward sidechain circuit topology exhibits less ripple on the control voltage than an equivalent feedback sidechain circuit topology designed with the same attack and release time constants to achieve an equivalent amount of signal compression. A thorough explanation of this fact can be found in *Application Note* 101A—*The Mathematics of Log-Based Dynamic Processors*, Rev. Sep. 28, 1995, produced by THAT Corporation, 734 Forest Street, Marlborough, Mass. 01752.

Additionally, by employing the preferred RMS method of level detection, in wide use and well known to those skilled in the art and aptly described in U.S. Pat. No. 3,681,618, issued to David E. Blackmer, it is again possible to gain the benefit that this method exhibits low rectification ripple which further reduces distortion of low frequency signals due to gain modulation of the audio signal by the ripple on the control voltage.

Also, it is well known that the human ear hears loudness in proportion to the RMS energy and thus the RMS detector responds appropriately to audio signals as compared to peak or averaging detectors. Additionally, this RMS detector exhibits the desirable property that it naturally operates at various speeds, reacting faster to higher slew rate signals and slower to slower moving signals. Further, this detector is of the "decilinear" type; that is, its output is linear in volts versus a logarithmic change of input signal voltage. The output level from this Blackmer RMS detector follows a control law which is specified in mV per dB.

With a decilinear detector, it is easy to add, subtract, and process control voltages in the "log domain" to thereby derive the proper variable gain element control signal, especially when using a preferred type of variable gain element which follows the same decilinear control law. One such variable gain element is the widely used dbx® uPC1252HA2 VCA, which is a monolithic integrated circuit manufactured by NEC Electronics Inc., available from THAT Corporation, Marlborough, Mass. under their 215X series part numbers. Those skilled in the art will know how to configure this dbx® VCA for compression and expansion functions.

The novel timing circuit is designed to be a non-linear low-pass filter such that it has multiple speeds of operation or time constants. Means are provided so that it reacts slowly to low frequency signals to avoid the distortion associated with tracking these waveforms. Other means are provided so that it reacts quickly to high-level transients avoiding overload distortion associated with attack times that are too slow to reduce the gain of the encoder. Further means are provided so that it releases quickly when the audio signal decays quickly to avoid audible noise modulation or "breathing." Lastly, means are provided to reduce dynamic distortion of low frequency signals without compromising the fast release time needed to avoid noise modulation which also minimizes distortion due to phase shift inherent in the transmission channel.

Through wise choice of thresholds, it is further possible to maximize audio transparency. As is well-known by those skilled in the art, noise modulation occurs in the output vs. input gain region where the audio signal is above the low threshold and below the high threshold. Below the low threshold, the attenuation of noise is constant and independent of the audio signal level, while above the high threshold, no attenuation of noise is occurring. In the region between the two thresholds, attenuation of the noise is a function of the audio signal level related by the compander ratio. A 2:1 ratio means that if the audio signal level changes by 1 dB, the noise changes by 2 dB. This change in the noise floor modulated by the audio signal is audible, which is the main reason existing noise reduction schemes limit the compander ratio to a low value such as 2:1 or, at most, 3:1. By setting the low compander threshold of the preferred embodiment significantly above the noise floor, it is possible to minimize the audibility of the noise modulation because the audio signal level is high enough to mask it. By setting the high threshold of the preferred embodiment significantly below the nominal audio signal level, the noise reduction is not doing anything the majority of the time with nominal signal levels. This is perfectly acceptable and desirable because nominal signal levels are very high compared to the noise floor and mask any noise present, and the variable gain elements exhibit optimum audio performance at unity gain when they are not amplifying or attenuating.

In a simple compander noise reduction system, there are four level-related output vs. input gain parameters: low threshold, high threshold, ratio, and amount of noise reduction with three degrees of freedom from which to choose, the fourth being determined by the choice of the other three. By choosing a low threshold point significantly above the noise floor, say −55 dBu, and a high threshold point significantly below the nominal signal level, say −25 dBu, and by choosing a reasonable amount of noise reduction in dB, say 24 dB, the ratio is automatically fixed at 5:1. This high ratio value would cause unacceptably audible artifacts in existing noise reduction systems, but due to the novel topology with a single feedforward sidechain employing simultaneous encode and decode, and due to the novel timing circuit and prudent choice of thresholds allowing plenty of "slop" above the noise floor and below nominal signal levels, it is thus possible to achieve the objective of audible transparency. Artifacts are virtually nonexistent and are certainly not audible in normal use.

Furthermore, the desired output vs. input gain parameters can be set by choosing fixed values of electrical components without being overly concerned with tight tolerances or component drifts with age or temperature because audible variability in the preferred embodiment is no longer related to component matching. Also, with "slop" designed into the low and high threshold parameters, and with the ability to tolerate high compansion ratios, functional variability is hardly a consideration with the noise reduction system of the preferred embodiment because even ten percent changes in component values do not affect its subjective operational characteristics. This robust design of the preferred embodiment allows the luxury of not having to trim any component values in manufacturing, and the end-user does not have to calibrate it in the field. Thus, the objective of the choice of components yielding substantially repeatable results in manufacturing and stable functionality in field use is met.

Another objective that the noise reduction system is to be relatively inexpensive is met because the implementation of the sidechain circuitry is much simpler than that of any good noise reduction system, where one sidechain is completely eliminated with its associated level detector and control voltage processing circuits as well as the level matching circuitry included in the sidechains of existing systems.

These and other objects, features, advantages and alternative aspects of the present invention will become apparent to those skilled in the art from a consideration of the following detailed description taken in combination with the accompanying drawings.

BRIEF DESCRIPTION OF THE DRAWINGS

The scope and advantages of the present invention will be more fully understood by referring to the following drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Figure 1:
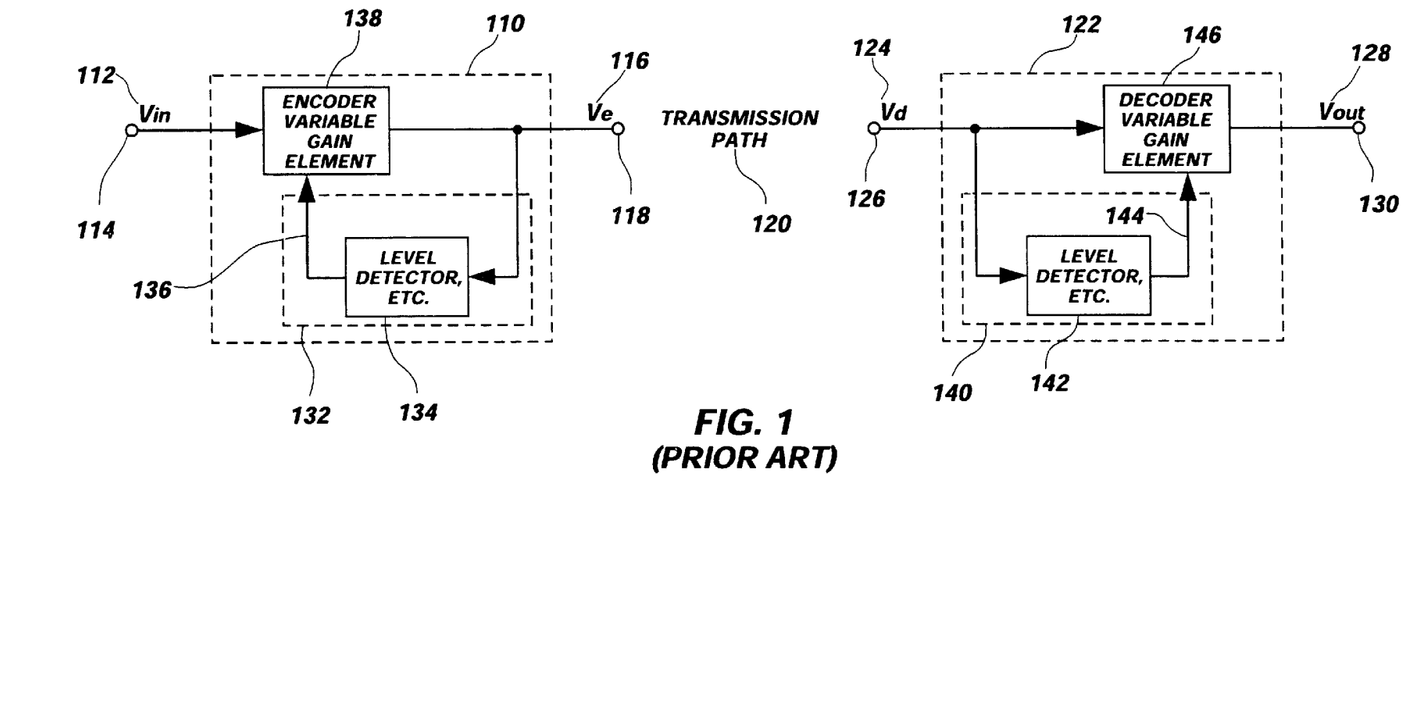
FIG. 1 is a simplified block diagram of a compander taught in the prior art and of the type described in U.S. Pat. No. 3,789,143.

Referring to FIG. 1, the compander of the type described in the prior art of U.S. Pat. No. 3,789,143 typically includes a compressor 110 for encoding or compressing the audio input signal Vin 112 applied to the audio input terminal 114; the compressed encoder output signal Ve 116 provided at the encoder output terminal 118 being transmitted through or recorded on the transmission path or channel 120. The decoder 122 receives the encoded signal Vd 124 at the decoder input terminal 126, after transmission through or playback from the channel 120, and expands the encoded signal Vd 124 to produce the audio output signal Vout 128 at the audio output terminal 130.

Many details of the circuit of FIG. 1 have been omitted to emphasize the basic circuit topology of this prior art. By referring to U.S. Pat. No. 3,789,143, one may gain a more thorough understanding of the specific workings of this type of companding system. On a fundamental level, the encoder sidechain 132 is of the feedback type consisting of the encoder output signal 116 routed to the block 134 labeled "Level Detector, etc." into which frequency weighting, level detection, timing, and control voltage processing are all lumped, producing the encoder variable gain element control voltage 136 which alters the gain of the encoder variable gain element 138 thus producing the desired amount of compression.

In a complementary fashion, the decoder sidechain 140 is of the feedforward type consisting of the encoder signal 124 routed to the block 142 labeled "Level Detector, etc." into which frequency weighting, level detection, timing, and control voltage processing are all lumped, producing the decoder variable gain element control voltage 144 which alters the gain of the decoder variable gain element 146 thus producing the desired amount of expansion.

Figure 2:
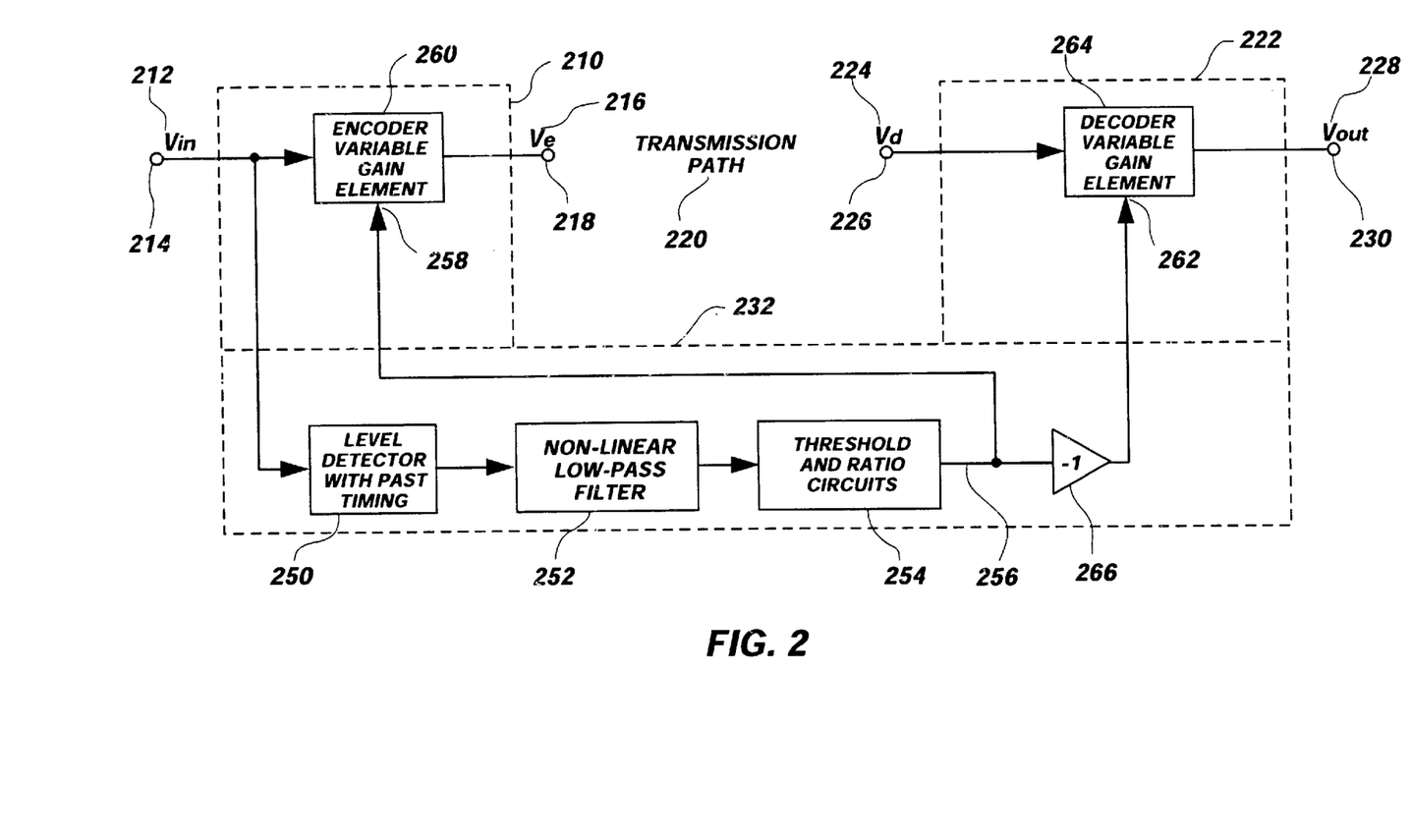
FIG. 2 is a block diagram illustrating the presently preferred embodiment of the compander system which is constructed in accordance with the principles of the present invention.

FIG. 2 is a block diagram of the presently preferred embodiment of the present invention wherein the audio input signal Vin 212 takes a similar path as in the compander described in FIG. 1. The audio input signal Vin 212 is applied to the audio input terminal 214 of the encoder 210; the compressed encoder output signal Ve 216 provided at the encoder output terminal 218 is transmitted through or recorded on the transmission path or channel 220. The decoder 222 receives the encoded signal Vd 224 at the decoder input terminal 226, after transmission through or playback from the channel 220, and expands the encoded signal Vd 224 to produce the audio output signal Vout 228 at the audio output terminal 230.

As opposed to having separate encoder 132 and decoder 140 sidechains, as in the compander described in FIG. 1, the present invention has a single sidechain 232 which is shared between the encoder 210 and the decoder 222. The shared sidechain 232 is of the feedforward type wherein the audio input signal Vin 212 is the signal source for the sidechain 232. This signal Vin 212 is provided at the input of a level detector 250 configured for fast timing. This level detector 250 is preferably an RMS detector, of which a widely used part is the dbx® monolithic RMS level detector, NEC part number uPC1253HA2, also available from THAT Corporation, Marlborough, Mass. under their 2252 part number. Those skilled in the art will know how to configure this detector with fast timing chosen such that the attack and release rates are on the order of 15 microseconds for a 30 dB step and 25,000 dB/sec, respectively.

The output of the level detector 250 is provided to a non-linear low-pass filter 252 which further shapes and processes the control signal after the attack and release timing circuits of the level detector 250 in a manner which will be apparent later. The non-linear low-pass filter 252 provides its output to threshold and ratio circuits 254 which respond in a level-dependent, substantially time-independent to thereby produce a control voltage 256 which is a function of the instantaneous level of the output signal of the non-linear low-pass filter 252. It is in these circuits 254 that the low and high thresholds, compansion ratio, and amount of compansion or noise reduction are determined.

The control voltage 256 may be applied directly to the control port 258 of the encoder variable gain element 260 if the gain element 260 is of the dbx type described previously. The control voltage 256 may also be applied directly to the control port 262 of the decoder variable gain element 264 if the gain element 264 is of the dbx type and the opposite polarity control port is used. Using the opposite polarity control port results in the opposite control law, −6 mV per dB versus 6 mV per dB, for instance, thus producing a complementary gain function between the encoder variable gain element 260 and the decoder variable gain element 264. Those skilled in the art are familiar with the differential nature of the control ports of the dbx® VCA and will know how to configure it to function appropriately.

Alternatively, an op-amp inverter stage 266 with tightly matched (1%) components may be placed between the output of the threshold and ratio circuits 254 and the control port 262 of the decoder variable gain element 264 to create the proper control voltage polarity if it is not possible or if it is preferable to use an opposite polarity control port.

Figure 3:
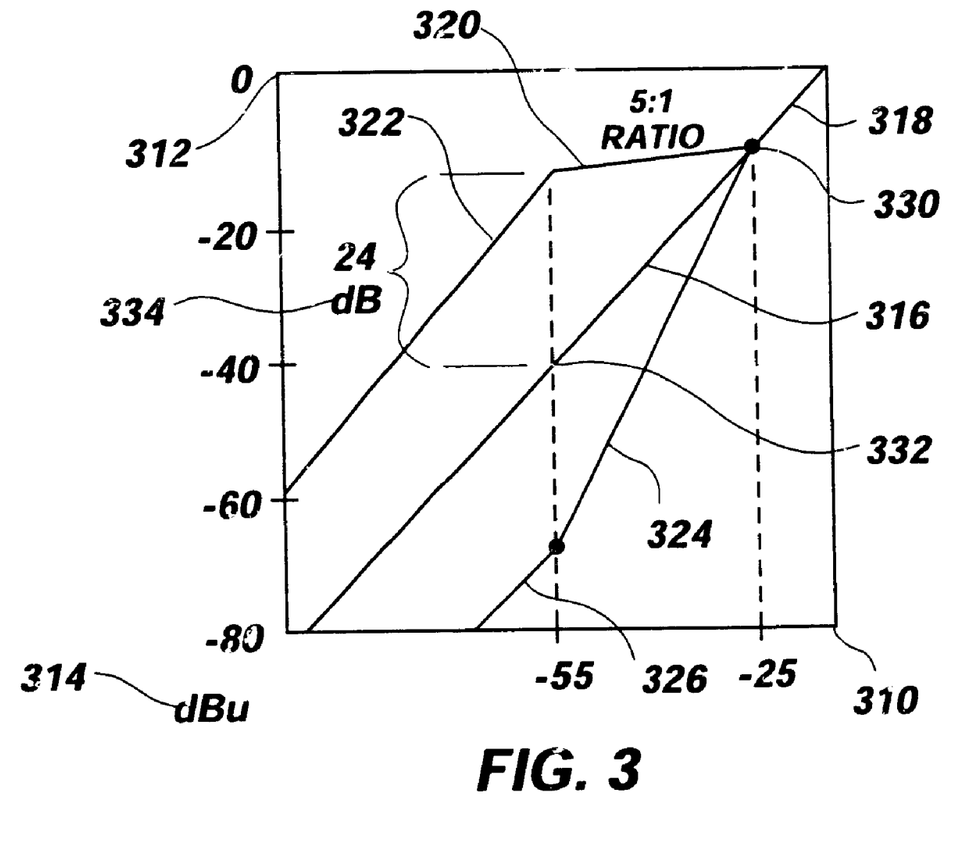
FIG. 3 illustrates in a graph the output vs. input gain relationships of the encoder and the decoder portions of the presently preferred embodiment.

FIG. 3 shows typical level-dependent output vs. input complementary gain functions of the encoder and the decoder. As shown, these are the gain functions in the presently preferred embodiment. The X-axis 310 and the Y-axis 312 are labeled in dBu 314 (ref. 0.775 V RMS). The diagonal line 316 represents a unity gain function from input to output. That is, the output level always equals the input level. The three topmost line segments 318, 320, 322 represent the output vs. input gain function of the encoder indicating that lower level signals are being amplified, thus compressing the dynamic range of the signal. The topmost segment 318 shared with the encoder gain function and the two lower line segments 324, 326 represent the output vs. input gain function of the decoder indicating that lower level signals are being attenuated, thus complementarily expanding the dynamic range of the signal.

The high threshold 330 is the point above which no compansion is occurring and both the encoder and decoder follow the unity gain segment 318 of their gain functions. The low threshold 332 is the point below which a constant amount of compansion or noise reduction is occurring and the encoder and decoder follow the lower segments 322, 326 of their respective gain functions. Between the high 330 and low 332 thresholds, the encoder and decoder follow their respective segments 320, 324 at a slope equal to the compansion ratio defined as N:1, where N is the change of the encoder input signal in dB required to cause a 1 dB change in the encoder output signal.

When the input signal to the compressor decreases below the level of the high threshold 330, a control voltage is produced to change the gain of the encoder VCA according to the 5:1 ratio slope of the middle segment 320 of the encoder gain function. The absolute value of this control voltage increases as the input signal level to the compressor decreases below the high threshold 330 to maintain the 5:1 ratio slope by causing the encoder VCA to add gain to the signal. For instance, when the input signal level falls 5 dB below the high threshold 330, the gain of the encoder VCA is 4 dB so that the output signal level of the compressor decreases by only 1 dB, hence the 5:1 ratio. Of course, this control voltage simultaneously causes the same amount of attenuation by the expander VCA.

When the input signal to the compressor decreases to the level of the low threshold 332, the input signal level has fallen 30 dB below the high threshold 330, and the control voltage produced causes 24 dB of gain 334 in the encoder so that the output signal level of the compressor has decreased by only 6 dB. This 24 dB represents the maximum amount of compansion or the theoretical amount of noise reduction ignoring any noise penalty paid when operating the variable gain elements with 24 dB of gain or attenuation.

Figure 4:
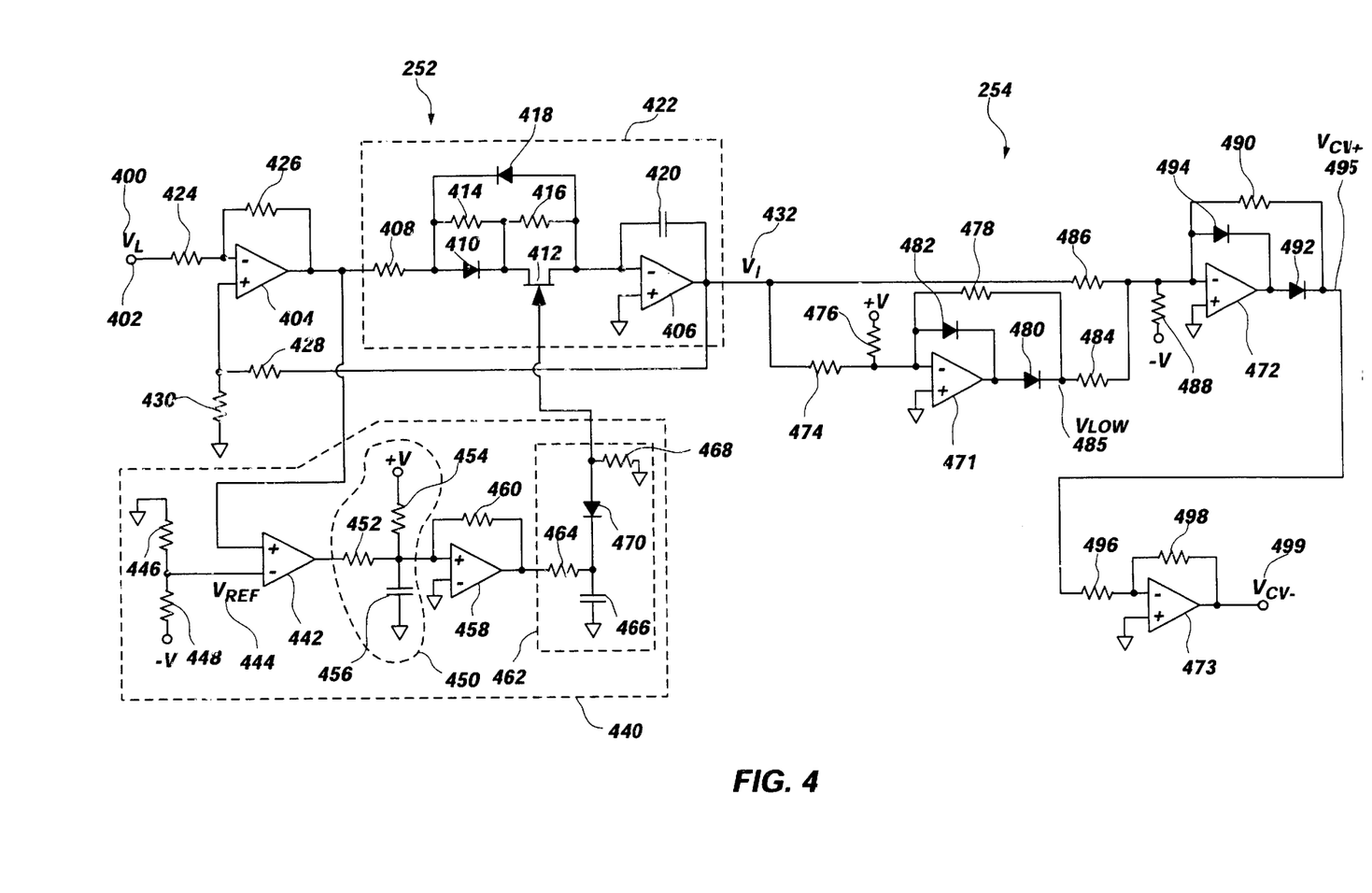
FIG. 4 is a circuit schematic showing the details of the non-linear, low-pass filter timing circuit which is then followed by the threshold and ratio circuit in the presently preferred embodiment.

FIG. 4 is the circuit schematic for the presently preferred embodiment of the non-linear low-pass filter 252 and the threshold and ratio circuits 254 of FIG. 2. The input signal $V_L$ 400, which is the control voltage from the level detector (250 in FIG. 2), is provided at the input terminal 402 of the filter 252. The audio portions of the filter 252 encompass a first 404 and a second 406 operational amplifier which form a low-pass filter at the output of the second amplifier 406 configured as an integrator 422. The characteristics of the filter 252 are that it "smooths" out ripple on the fast control voltage VL 400 from the level detector for slow-moving signals while speeding up, i.e. increasing its cut-off frequency, to react to fast moving signals, thus producing an appropriate integrator output control voltage VI 432.

Resistors 424, 426, 428, 430 associated with the first amplifier 404 set the short-term and long-term gain of the amplifier 404 to control what level of signal is required for the integrator's 422 RC time constant to be changed. The detector control voltage VL 400 is applied to the input terminal of the first amplifier 404 through an input resistor 424. A feedback resistor 426 is connected from the output of the first amplifier 404 back to its "−" input terminal. A second feedback resistor 428 is connected from the output of the integrator 422 back to the "+" input terminal of the first amplifier 404. A feedback attenuation resistor 430 is connected from the "+" input of the first amplifier 404 to ground which determines, along with the second feedback resistor 428, the amount of negative feedback from the integrator 422.

Resistors 408, 414, 416, diodes 410, 418, an n-channel junction field-effect transistor (JFET) 412, and a capacitor 420 associated with the second amplifier 406 form an integrator 422 whose time constant is directly proportional to the instantaneous value of resistance of the series/parallel combination of the resistors 408, 414, 416, diodes 410, 418, and JFET 412 and the value of the capacitor 420. The output of the first amplifier 404 is provided to the input of the integrator 422 through a first integrator resistor 408 having a small resistance value. A first integrator conducting path is formed through this resistor 408 being connected in series to the anode of a first integrator diode 410 with the source or drain terminal of the JFET 412 connected in series to the cathode of that same diode 410. The other drain or source terminal of the JFET 412 is connected to the "−" input terminal of the integrator amplifier 406 which is held at "virtual ground" by the integrator amplifier 406 because the "+" input of the second amplifier 406 is at ground. Other integrator conducting paths are formed by adding additional integrator resistors 414, 416 and a second integrator diode 418. The second integrator resistor 414 having a resistance value approximately 100 times that of the first integrator resistor 408 is connected in parallel with the first integrator diode 410, while a third integrator resistor 416 having a resistance value approximately 5 times that of the second integrator resistor 414 is connected in parallel with the JFET 412 across the source and drain. The second integrator diode 418 is connected in parallel with the series combination of the first integrator diode 410 and the JFET 412, the cathode of the second integrator diode 418 being connected to the anode of the first integrator diode 410 with the anode being connected to the "−" input terminal of the integrator amplifier 406.

A comparator-based hold circuit 440 is used to control the RC time constant of the integrator 422. The output of the first amplifier 404 of the non-linear filter 252 is connected to the "+" input of a first comparator 442 whose reference voltage VREF 444 for its switching threshold is set by a resistive voltage divider between ground and −V, the reference voltage VREF 444 being the point between a resistor 446 connected to ground and another resistor 448 connected to −V. VREF 444 is connected to the "−" input of the first comparator 442. The −V and +V supply rails are typically −15V and +15V, respectively, and are used to power all active circuitry. The output of the first comparator 442 is applied to a first RC timing circuit 450 consisting of a first resistor 452 connected between the output of the first comparator 442 and the junction between a second resistor 454 connected to +V, a capacitor 456 connected to ground, and the "+" input of a second comparator 458. A positive feedback resistor 460 is connected from the output of the second comparator 458 back to its "+" input, while its "−" input is referenced to ground. The output of the second comparator 458 is applied to a second RC timing circuit 462 whose timing is determined by the values of a first resistor 464, a capacitor 466, and a second resistor 468. The first resistor 464 is connected between the output of the second comparator 458 and the capacitor 466 whose other end is connected to ground. The junction between the first resistor 464 and the capacitor 466 is connected to the cathode of a diode 470 with its anode connected to the gate terminal of the JFET 412 in the integrator 422 to control the conductivity of the JFET 412. One end of the second resistor 468 is also connected to this diode 470 and JFET 412 junction, while the other end is connected to ground.

In steady state, the resistance part of the RC time constant of the integrator 422 is fairly large, creating a fairly long time constant on the order of 10 milliseconds. The total integrator resistance at steady state is determined by the series combination of the first 408 and second 414 integrator resistors because the third integrator resistor 416 is shorted across by the JFET 412. Also, in steady state, the output of the first amplifier 404 is essentially at ground, excepting any offsets. After a period of time during which slow-moving signals have been detected, if a fast transient is detected which causes a positive-going detector control voltage VL 400, because the fairly long RC time constant of the integrator 422 delays negative feedback from the integrator output control voltage VI 432 back to the first amplifier 404, initially this amplifier 404 produces an exaggerated amount of gain. This amplifier 404 inverts the control voltage VL 400 producing a fast, negative-going spike to the input of the integrator 422. Because the anode of the second integrator diode 418 is held at virtual ground, as soon as the voltage level at the cathode of the second integrator diode 418 is sufficiently low enough to forward bias it, the second 414 and third 416 integrator resistors are effectively shorted across, thus drastically reducing the equivalent resistance of the RC time constant to approximately the value of the first integrator resistor 408, allowing the filter 252 to speed up and pass the fast transient. This fast RC time constant is on the order of 100 microseconds ensuring that the attack characteristics of the filter 252 are very fast. When the fast transient causes a spike, the negative feedback from the integrator output control voltage VI 432 quickly attempts to return the output of the first amplifier 404 to ground.

The reaction of the release characteristics of the filter 252 are similar to the attack characteristics when the fast transient decays quickly. In this case, VL 400 decreases rapidly producing a fast, positive-going spike to the input of the integrator 422. Because the cathode of the first integrator diode 410 is held at virtual ground, as soon as the voltage level at the anode of the first integrator diode 410 is sufficiently high enough to forward bias it, the second 414 integrator resistor is effectively shorted across, and because the JFET 412 is shorting across the third integrator resistor 416, again the equivalent resistance of the RC time constant is reduced to approximately the value of the first integrator resistor 408, allowing the filter 252 to speedily release at the end of the fast transient.

When the output of the first amplifier 404 goes below VREF 444 due to the attack of a sudden transient, as described before, the output of the first comparator 442 switches from a positive state to a negative state. VREF 444 is chosen to be slightly negative, about −75 mV, to ensure that offsets from the output of the first amplifier 404 do not falsely trigger the first comparator 442. The comparators 442, 458 are open-collector types which, in the positive state, pull up to whatever voltage source is connected to the output through a pull-up resistor. The first comparator 442 pulls toward +V through the series combination of the first 452 and second 454 resistors in the first RC timing circuit 450. In the negative state, the outputs of the comparators 442, 458 tend toward −V through the collector-emitter of a saturated transistor whose emitter is connected to −V internal to each comparator. The negative-going time constant of this first RC timing circuit 450 essentially sets a delay time in the hold circuit 440. When the first comparator 442 goes negative, the second comparator 458, whose switching threshold is referenced at ground, quickly follows after a short delay during which the capacitor 456 is discharging through the first resistor 452 toward −V. When the capacitor 456 voltage at the "+" input of the second comparator 458 reaches the ground reference, the second comparator 458 switches. This delay time, on the order of 220 microseconds, ensures that very fast, high-frequency, short-duration signals do not trigger the hold function.

For longer duration signals which trigger the second comparator 458, the attack time constant of the second RC timing circuit 462 is on the order of 10 microseconds so it adds a negligible amount to the 220 microsecond delay time of the first timing circuit 450. The function of the first resistor 464 of the second timing circuit 462 is simply to limit the comparator 458 attack current when switching negative to avoid injecting switching noise in other circuits. The positive feedback resistor 460 is very large and provides a small amount of hysteresis to stabilize the second comparator 458 so that it does not "flutter" or rapidly change states in situations where the signal from the first timing circuit 450 "hovers" around the threshold of the second comparator 458. When the second comparator 458 goes negative, the diode 470 connected to the gate of the JFET 412 becomes forward-biased allowing the voltage on the gate of the JFET 412 to go low enough to turn it off thus starting the hold time of the integrator 422.

The hold time of the integrator 422 starts whenever the comparator circuits sense a fast enough transient with a long enough duration to trigger the second comparator 458. Before this transient triggers the hold time to start, the integrator capacitor 420 is essentially charged to the value of VL 400 times the gain of the non-linear filter 252 assuming that, previous to this, VL 400 was at a fairly constant level for a period of time. After the JFET 412 turns off at the start of the hold time, if the control voltage VL 400 from the level detector decreases because it no longer senses a high level signal, a positive-going spike at the output of the first amplifier 404 causes the second integrator diode 418 to become reverse-biased and the first integrator diode 410 to become forward-biased, thus shorting across the second integrator resistor 414. The resistive part of the RC time constant of the integrator 422 is then essentially equal to the first integrator resistor 408 in series with the third integrator resistor 416. The resulting RC time constant, approximately 50 milliseconds, slows down the integrator 422 enough that, relative to the faster time constants, the voltage on the integrator capacitor 420 is held "constant." Even if the input control voltage VL 400 drops rapidly, the voltage on the integrator capacitor 420 changes relatively slowly.

The end of the hold time is triggered when one of two scenarios occur. In the first scenario, the control voltage VL 400 from the level detector decreases, i.e. changes direction, because it no longer senses a high level signal and a positive-going spike is created at the output of the first amplifier 404 because the feedback from the integrator 422 is delayed due to its slow timing. The first comparator 442 is triggered by this to switch to a positive state and starts to pull up according to the RC time constant formed by the second resistor 454 and the capacitor 456 of the first RC timing circuit 450. After approximately 25 milliseconds, the voltage on the capacitor 456 reaches the ground reference to trigger the second comparator 458 to start to pull up according to the RC time constant formed by the second resistor 468 and capacitor 466 of the second RC timing circuit 462. This second resistor 468 is on the order of 1 M ohms, and with the capacitor on the order of 820 pF, and depending on the switching threshold of the JFET 412, the delay time of this RC timing circuit is approximately 1 millisecond, but is negligible compared to the 25 millisecond delay upstream. The voltage on the gate of the JFET 412 is always one diode drop, about 0.7 V, above the voltage on the capacitor 466. When the voltage on the capacitor 466 of the second RC timing circuit 462 charges high enough for the gate of the JFET 412 to turn on, the conduction of the JFET 412 again restores the very fast 100 microsecond RC time constant for the integrator 422, thus ending the hold time. In the second scenario, the hold time is triggered by a signal that reaches a particular level and its level stays fairly constant giving the integrator 422 a chance to bring the output of the first amplifier 404 back to ground which triggers the first comparator 442 to switch to a positive state forcing the same chain of events described above.

For signals that are too short in duration to trigger the hold function, when the control voltage VL 400 from the level detector rapidly decreases because it no longer senses a high level signal, a positive-going spike at the output of the first amplifier 404 causes the second integrator diode 418 to become reverse-biased and the first integrator diode 410 to become forward-biased, thus shorting across the second resistor 414. Because the JFET 412 is still conducting, the resistive part of the RC time constant of the integrator 422 is essentially still equal to the first resistor 408. This approximately 100 microsecond RC time constant allows the compander to quickly recover in a manner that the fade-out of the noise does not obtrusively lag the fade-out of the audio signal. This same process can occur during the hold time; that is, the process where the first amplifier 404 tries to speed up the integrator 422 RC time constant by forward biasing the first diode 410 with the positive-going spike created when the control voltage VL 400 decays rapidly; but with the JFET 412 turned off, the resistance of the integrator 422 RC time constant is dominated by the large value of the third integrator resistor 416 forcing the time constant to be long.

The slow timing during the hold time ensures that the fast time constants necessary for quickly and inaudibly engaging and releasing the compansion processes do not allow excessive ripple to cause unacceptable dynamic distortion. The slow timing minimizes ripple on the control voltage by preventing the non-linear filter 252 from tracking low frequency signals. It also prevents distortion of the audio signal due to phase shifts in the transmission path. In the specific case of an equalizer, there are phase shifts inherent in each of the bandpass filters which result in distortion of the audio signal because the decode happens simultaneously with the encode. Because the decoder is not acting upon the same signal, but on a delayed version of the signal, some audible distortion of the audio signal can occur, especially at low frequencies where the phase shift represents a longer delay time. Fortunately, the slow timing due to the hold circuit does not allow the output of the non-linear filter to track low-frequency waveforms, thus avoiding audible artifacts which would otherwise be present in worst-case situations when, for example, using an equalizer set up to provide radical low-frequency equalization. Of course, if the same phase shift inherent in the transmission channel were applied to the decode signal, this problem could be completely avoided, but the added complexity to do so could not be justified given the audibly transparent results obtained with the non-linear filter.

The "fast attack-hold-fast release" process of the non-linear filter more than adequately satisfies the objective of maintaining audible integrity. Without the hold time, a longer attack time, longer release time, or a combination of both longer attack and release times would be necessary to reduce dynamic distortion and phase-shift induced distortion to an acceptable level. A longer attack time results in loss of headroom for fast, high-level transients as the compressor is too slow to reduce the gain of the encoder to avoid audible clipping, while a longer release time results in unacceptably audible noise modulation as the noise slowly fades out long after the audio signal is gone. The human ear is much less sensitive to noise which lags the end of the audio signal by 25 milliseconds, then disappears quickly, than it is to noise that starts to decay as soon as the audio signal decays but then fades out much more slowly. Thus, the audible effects of noise remnants are substantially reduced.

The threshold and ratio circuits 254 encompass a first rectifier amplifier 471, a second rectifier amplifier 472, and a buffer amplifier 473, of which the first rectifier amplifier 471 and associated components 474, 476, 478, 480, 482 determine the low compansion threshold, the second rectifier amplifier 472 and associated components 484, 486, 488, 490, 492, 494 determine the high compansion threshold, and the buffer amplifier 473 and associated resistors 496, 498 buffer the control voltage from the second rectifier amplifier 472. The integrator output control voltage VI 432 feeds, in parallel, the "−" input of the first rectifier amplifier 471 through a first input resistor 474 and the "−" input of the second rectifier amplifier 472 through a second input resistor 486. A first offset resistor 476 is connected from +V to the "−" input of the first rectifier amplifier 471 and a second offset resistor 488 is connected from −V to the "−" input of the second rectifier amplifier 472. The "+" inputs of the first 471 and second 472 rectifier amplifiers and the buffer amplifier 473 are all grounded. The anode of a first diode 480 is connected to the output of the first rectifier amplifier 471, while its cathode is connected to a first feedback resistor 478 connected back to the "−" input of the first rectifier amplifier 471. Likewise, the anode of a second diode 492 is connected to the output of the second rectifier amplifier 472, while its cathode is connected to a second feedback resistor 490 connected back to the "−" input of the second rectifier amplifier 472.

The cathode of a third diode 482 is connected from the output of the first rectifier amplifier 471, while its anode is connected back to the input of the first rectifier amplifier 471. Likewise, the cathode of a fourth diode 494 is connected from the output of the second rectifier amplifier 472, while its a node is connected back to the "−" input of the second rectifier amplifier 472. The output signal at the cathode of the first diode 480 is applied through a third input resistor 484 to the "−" input of the second rectifier amplifier 472. The output signal VCV+ 495 at the cathode of the second diode 492 is applied through a fourth input resistor 496 to the "−" input of the buffer amplifier 473. A third feedback resistor 498 is connected back to the "−" input of the buffer amplifier 473. The output of the buffer amplifier 473, VCV− 499, controls the variable gain elements of the encoder and decoder.

To produce the output vs. input gain functions illustrated in FIG. 3, first 471 and second 472 rectifier amplifiers are configured as standard positive precision half-wave rectifiers where diodes 480, 492 allow only unidirectional output voltages. The first offset resistor 476 sets the low threshold while the second offset resistor 488 sets the high threshold. In the system, the output of the RMS level detector VL 400 ranges between approximately −300 mV for low-level signals and +300 mV for high-level signals, the middle of the range being approximately 0 mV when detecting a −25 dBu input signal. Because the high threshold is chosen to be at −25 dBu, it is possible to eliminate the second offset resistor 488 because, without it, the threshold of the second rectifier amplifier 472 is already at 0 mV. To shift the threshold higher, this offset resistor 488 would need to be present and connected to −V. Likewise, to shift the threshold lower, the resistor 488 would need to be connected to +V.

For high-level audio signals, the integrator output control voltage VI 432 is positive and, if VI 432 is above the low and high thresholds, neither rectifier amplifier 471, 472 allows any control voltage through, meaning that the control voltage controlling the variable gain elements is 0 V resulting in unity gain through the encoder and decoder. When VI 432 decreases to the level of the high threshold, the second rectifier amplifier 472 inverts the signal and begins to pass a positive control voltage VCV+ 495 related to VI 432 by the gain factor set by the second feedback resistor 490 divided by the second input resistor 486. The gain factor sets the desired compansion ratio which, in the present system, sets the ratio at approximately 5:1. The positive control voltage VCV+ 495 gets buffered and inverted at unity gain by the buffer amplifier 473 to create VCV− 499 which controls the encoder and decoder variable gain elements, which in this system are dbx-type VCAs. As VCV+ 495 increases, the compressor gain increases while the expander gain complementarily decreases. Between the two thresholds, as VI 432 continues to decrease, VCV+ 495 continues to increase until VI 432 reaches the low threshold. The low threshold of the first rectifier amplifier 471 would again be at about −25 dBu if the first offset resistor 488 was not present, but this resistor 488 tied to +V shifts the threshold more negative, to about −55 dBu in the system. At this point, the first rectifier amplifier 471, set for unity gain, starts creating a positive control voltage VLOW 485 opposite to VI 432. With the second 486 and third 484 input resistors set to the same value, VLOW 485 cancels additional changes in VI 432 effectively holding VCV+ 495 at the voltage it reached at the point when VI 432 decreased to the lower threshold. So for signals below the low threshold, a constant amount of compansion occurs. Thus, the gain functions of FIG. 3 are obtained. Buffering of VCV+ 495 is necessary to drive the VCAs because the output impedance of the source must always be low which is not the case with the second rectifier amplifier 472 when it is not producing a positive control voltage. VCV− 499 may be used to drive both the encoder and decoder VCAs configured to use control ports opposite of each other to achieve complementary gain functions, or VCV− 499 may be inverted by another amplifier stage with tight tolerance (1%) resistors, making use of the same polarity control ports in both the encoder and decoder VCAs.

The following table lists component values used in the presently preferred embodiment illustrated in FIG. 4:

TABLE 1

| Element | Value | Element | Value | Element | Value |
| --- | --- | --- | --- | --- | --- |
| R408 | 1 kΩ | R446 | 100 Ω | R476 | 46.4 kΩ |
| D410 | 1N4148 | R448 | 20 kΩ | R478 | 4.99 kΩ |
| Q412 | J112 | R452 | 3.3 kΩ | D480 | 1N4148 |
| R414 | 100 kΩ | R454 | 330 kΩ | D482 | 1N4148 |
| R416 | 470 kΩ | C456 | 0.1 μF | R484 | 4.99 kΩ |
| D418 | 1N4148 | U458 | LM339 | R486 | 4.99 kΩ |
| C420 | 0.1 μF | R460 | 22 MΩ | R488 | Omit |
| R424 | 3.24 kΩ | R464 | 10 kΩ | R490 | 16.2 kΩ |
| R426 | 12.1 kΩ | C466 | 820 pF | D492 | 1N4148 |
| R428 | 10 kΩ | R468 | 1 MΩ | D494 | 1N4148 |
| R430 | 1 kΩ | D470 | 1N4148 | R496 | 10 kΩ |
| U442 | LM339 | R474 | 4.99 kΩ | R498 | 10 kΩ |

Whereas this invention is here illustrated and described with reference to the presently contemplated best mode of carrying out the invention in practice, it is to be understood that various changes may be made in adapting the invention to different embodiments without departing from the broader inventive concepts disclosed. Some alternate embodiments of the invention, although not specifically described in detail, have either been mentioned or would be obvious to those skilled in the art in light of the disclosure above for the presently preferred embodiment. Specifically, alternative embodiments were mentioned wherein the decode signal is delayed to accommodate systems which have significant delay in the transmission path. Alternate embodiments wherein the encoder and decoder have been traditionally separate, such as with analog tape or radio transmission, for instance, may be realized to benefit from the sonic integrity of the noise reduction system at the expense, of course, of adding circuit complexity and extra channel bandwidth necessary to carry out such a scheme.

Other embodiments logically extend to include the use of multi-band compansion techniques to obtain incremental gains in audible performance. These alternative techniques split the audio band into a plurality of frequency bands for compansion of individual frequencies, later recombining the bands, but the expense and complexity of such a system is hard to justify given the results that are obtained from the relatively simple system of the preferred embodiment. Also, because there are already variable gain elements in the noise reduction circuitry, one or both elements could serve multiple functions. For example, the decoder VCA could be used along with additional sidechain circuitry as part of a compressor, limiter or other circuits which would occur to those skilled in the art in light of the present invention.

Lastly, it would occur to those skilled in the art that alternate embodiments may be realized using complementary pre-emphasis and de-emphasis high-frequency weighting as in existing noise reduction systems for further reduction of noise at the expense of compromised headroom, frequency response errors due to mismatching of components, and added cost.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A companding noise reduction system for processing sonic frequencies while minimizing distortion thereof, said system comprising:
    an encoder for compressing an input signal representative of the sonic frequencies to be processed, wherein the encoder includes a first variable gain element which receives the input signal and develops as an output signal a compressed signal which is delivered to a transmission path;
    a decoder for expanding the compressed signal, wherein the decoder includes a second variable gain element which receives the compressed signal from the transmission path and then develops as an output signal the processed sonic frequencies; and
    a single feedforward sidechain which is electrically coupled to the encoder and the decoder, wherein a control signal is developed by the single feedforward sidechain in response to the input signal and utilized to thereby control gain of the first variable gain element and the second variable gain element.

2. The companding noise reduction system as defined in claim 1 wherein the single feedforward sidechain further comprises a level detector for detecting an amplitude of the input signal, wherein the level detector receives the input signal, and wherein the control signal is developed in response to the amplitude of the input signal.

3. The companding noise reduction system as defined in claim 2 wherein the single feedforward sidechain further comprises a non-linear low-pass filter which receives as input an output signal from the level detector.

4. The companding noise reduction system as defined in claim 3 wherein the non-linear low-pass filter further comprises means for decreasing a response time thereof in response to an increase in a rate of change of the input signal.

5. The companding noise reduction system as defined in claim 4 wherein the single feedforward sidechain further comprises a threshold and ratio circuit which responds in a level-dependent and substantially time independent manner to thereby generate the control signal, wherein the control signal is a function of an instantaneous level of an output signal from the non-linear low-pass filter.

6. The companding noise reduction system as defined in claim 5 wherein the single feedforward sidechain further comprises a means for reversing a polarity of the control signal, wherein the reversed polarity control signal is transmitted to the second variable gain element to thereby provide an opposite control signal to the decoder.

7. The companding noise reduction system as defined in claim 5 wherein the control signal is electrically coupled to the first variable gain element.

8. The companding noise reduction system as defined in claim 5 wherein the threshold and ratio circuit includes means for determining a high and a low threshold, a compansion ratio, and an amount of noise reduction to be achieved by the system.

9. The companding noise reduction system as defined in claim 1 wherein the transmission path is selected from a group of transmission systems exhibiting limited dynamic range consisting of a graphic equalizer, a parametric equalizer, and an FM broadcast system.

10. A method for noise reduction using a companding system for processing sonic frequencies while minimizing distortion thereof, said method comprising the steps of:
    (1) compressing the input signal representative of the sonic frequencies to be processed utilizing an encoder, and delivering the compressed signal to a transmission path of limited dynamic range;
    (2) decompressing the compressed signal received from the transmission path utilizing a decoder to thereby generate the processed sonic frequencies;
    (3) developing a control signal in a single feedforward sidechain which receives the input signal;
    (4) controlling gain of a first variable gain element in the encoder utilizing the control signal developed in the single feedforward sidechain;
    (5) reversing polarity of the control signal; and
    (6) controlling gain of a second variable gain element in the decoder utilizing the reversed polarity control signal.

11. The method for noise reduction using a companding system as defined in claim 10 wherein the method further comprises the step of detecting an amplitude of the input signal in the single feedforward sidechain, wherein the control signal is developed in response to the amplitude of the input signal.

12. The method for noise reduction using a companding system as defined in claim 11 wherein the method further comprises the step of processing the control signal utilizing a non-linear low-pass filter after level detection of the input signal.

13. The method for noise reduction using a companding system as defined in claim 12 wherein the method further comprises the step of decreasing a response time of the non-linear low-pass filter in response to an increase in a rate of change of the input signal.

14. The method for noise reduction using a companding system as defined in claim 13 wherein the method further comprises the step of generating the control signal utilizing a level-dependent and substantially time independent manner, wherein the control signal is a function of an instantaneous level of an output signal from the non-linear low-pass filter.

15. The method for noise reduction using a companding system as defined in claim 14 wherein the method further comprises the steps of:
(1) determining a high threshold and a low threshold;
(2) determining a compansion ratio;
(3) determining an amount of noise reduction to be achieved by the system; and
(4) setting the high threshold, the low threshold, and the amount of noise reduction to be achieved by the system in the single feedforward sidechain.

16. The method for noise reduction using a companding system as defined in claim 10 wherein the method further comprises the step of adapting the system to compensate for delays in the transmission path which cause distortion due to phase shift in the transmission path.

17. The method for noise reduction using a companding system as defined in claim 10 wherein the method further comprises the step of setting noise reduction parameters such that the system is substantially audibly transparent on the sonic signal when a signal level thereof is relatively close to a nominal signal level.

18. The method for noise reduction using a companding system as defined in claim 10 wherein the method further comprises the step of eliminating a need for component matching in the encoder and the decoder because the control signal is developed from the single feedforward sidechain.

19. The method for noise reduction using a companding system as defined in claim 10 wherein the method further comprises the step of eliminating errors due to non-linearities associated with a transmission path by utilizing the single feedforward sidechain for the encoder and the decoder.

20. The method for noise reduction using a companding system as defined in claim 11 wherein the method further comprises the step of utilizing a root mean square (RMS) level detection method.

21. The method for noise reduction using a companding system as defined in claim 10 wherein the method further comprises the step of minimizing distortion of low frequency signals in the input signal by decreasing audio gain modulation due to a ripple on the control signal.

22. The method for noise reduction using a companding system as defined in claim 11 wherein the method further comprises the step of providing multiple speeds of operation of the system by utilizing the non-linear low-pass filter as a timing circuit.

23. The method for noise reduction using a companding system as defined in claim 22 wherein the method further comprises the step of causing the non-linear low-pass filter to react slowly to low frequency signals to thereby avoid distortion associated with level detection of the input signal.

24. The method for noise reduction using a companding system as defined in claim 23 wherein the method further comprises the step of causing the non-linear low-pass filter to react rapidly to high-level transients to thereby avoid overload distortion associated with attack times that are too slow to reduce the gain of the encoder.

25. The method for noise reduction using a companding system as defined in claim 24 wherein the method further comprises the step of causing the non-linear low-pass filter to release rapidly when the input signal decays quickly to thereby avoid audible noise modulation.

26. The method for noise reduction using a companding system as defined in claim 25 wherein the method further comprises the step of reducing dynamic distortion of low frequency input signals without affecting the rapid release time needed to avoid noise modulation.

27. The method for noise reduction using a companding system as defined in claim 26 wherein the method further comprises the step of setting the low threshold substantially above a noise floor to thereby minimize audibility of the noise modulation because the signal level is sufficiently high to mask the noise modulation.

28. The method for noise reduction using a companding system as defined in claim 10 wherein the method further comprises the step of eliminating a need for calibration of the system by utilizing the single feedforward sidechain topology.

29. The method for noise reduction using a companding system as defined in claim 27 wherein the method further comprises the steps of:
(1) reducing ripples on a control signal that are generated by the level detector by preventing the non-linear low-pass filter from tracking low frequency input signals; and
(2) increasing a cut off frequency of the control signal to thereby react rapidly to a fast input signal.

30. The method for noise reduction using a companding system as defined in claim 29 wherein the method further comprises the step of preventing distortion of the input signal due to phase shifts in the transmission path.

31. The method for noise reduction using a companding system as defined in claim 30 wherein the method further comprises the step of utilizing a fast attack, then hold, then rapidly release process in the non-linear low-pass filter to thereby maintain input signal integrity.

* * * * *